United States Patent [19]

Barker

[11] Patent Number: 5,315,238

[45] Date of Patent: May 24, 1994

[54] TESTING APPARATUS HAVING AN AIR PERMEABLE INTERFACE PANEL SPACED FROM A TEST HEAD

[75] Inventor: Colin G. Barker, Bollington, England

[73] Assignee: Innovate Limited, Northampton, England

[21] Appl. No.: 765,899

[22] Filed: Sep. 26, 1991

[51] Int. Cl.⁵ .............................................. G01R 31/02
[52] U.S. Cl. ............................ 324/158 F; 324/158 P
[58] Field of Search ............. 324/158 F, 158 P, 72.5, 324/93.1; 439/482

[56] References Cited

U.S. PATENT DOCUMENTS

| | | | |
|---|---|---|---|
| 4,321,532 | 3/1982 | Luna | 324/158 F |
| 4,352,061 | 9/1982 | Matrone | 324/158 P |
| 4,357,062 | 11/1982 | Everett | 324/158 F |
| 4,551,673 | 11/1985 | Barth et al. | 324/158 F |
| 4,551,675 | 11/1985 | Heys et al. | 324/158 F |
| 4,626,776 | 12/1986 | Wilkinson | 324/158 P |
| 4,758,780 | 7/1988 | Coon et al. | 324/158 F |
| 4,780,086 | 10/1988 | Jenner | 324/158 F |
| 4,803,424 | 2/1989 | Ierardi | 324/158 P |
| 4,851,765 | 7/1989 | Driller et al. | 324/158 F |
| 4,870,354 | 9/1989 | Davaut | 324/158 P |
| 5,027,063 | 6/1991 | Letourneau | 324/158 P |

FOREIGN PATENT DOCUMENTS

| | | |
|---|---|---|
| 3524229 | 1/1986 | Fed. Rep. of Germany ... 324/158 F |
| 0139262 | 6/1988 | Japan .............................. 324/158 F |

*Primary Examiner*—Vinh Nguyen
*Attorney, Agent, or Firm*—Longacre & White

[57] ABSTRACT

A test fixture for use in test apparatus for testing printed circuit boards and the like, includes a test head having a platen mounting test probes. An interface panel is spaced from the platen and mounts pads, the test probes and the interface panel being connected by minimum length wiring. A vacuum chamber is created between the platen and automatic test equipment.

15 Claims, 4 Drawing Sheets

TESTING APPARATUS HAVING AN AIR PERMEABLE INTERFACE PANEL SPACED FROM A TEST HEAD

This invention relates to test apparatus which includes a test fixture in combination with automatic test equipment (ATE), for use in the testing of electrical/electronic components such as printed circuit boards.

Automatic test equipment (ATE) used for the testing of assembled printed circuit boards (pcbs) generally requires some form of test fixture in order to make contact between the ATE and the particular pcb or unit under test (UUT). The ATE will then use a computer software package called a test program, combined with the electronic circuitry of the ATE to perform the required test. The test fixture takes the form of two electrical interfaces joined by wiring. FIG. 1.

The interface which makes contact with the ATE, called the fixture interface, (also referred to as the interface panel) comprises a uniform array of electrical pads or connectors mounted in some mechanical arrangement which allows the electrical pads or connectors to make an electrical connection with the mating part of the ATE, generally known as the ATE receiver. The fixture interface may be aligned and brought into contact with the ATE receiver by a variety of means, which may be manual, mechanical or assisted by vacuum, pneumatic or electrical sources.

The interface between the test fixture and the UUT is generally known as a test head. The function of the test head is to enable an operator of the ATE to readily make contact between the UUT and the test fixture. The way in which the contact is to be made will depend upon the method of electrical testing to be performed by the ATE. This will generally be one of two methods, viz:

a plug-in (or functional) test, where the UUT is plugged into a suitable connector mounted on the fixture in much the same way as it would plug into the equipment in which it is designed to be used; or a 'Bed of Nails' test, where the UUT is contacted by a number of spring contact probes at various parts of the UUT and wherein the test head may use mechanical, pneumatic or vacuum methods to achieve the compression of the spring contact probes in the desired position in contact with the UUT.

The particular application being considered will describe this process with regard to a test fixture where the test head uses spring contact probes to make contact with the UUT and a vacuum chamber to achieve compression of the spring contact probes. The particular application also involves the use of spring contact probes installed in the ATE receiver to make contact with suitable contact pads in the fixture interface.

Having made contact with the UUT, the ATE passes a number of electrical signals to the UUT and measures the resulting voltages and currents, all of which generally pass through the wiring within the fixture. It is known that when signals of high frequency are passed between the ATE and the UUT, the length of the electrical conducting path between the ATE and the UUT may in itself affect the results of the test being performed. In particular it is desirous that the electrical path between ATE and UUT should be of minimum length. In order to help minimise the electrical path, modern ATE is constructed such that the electronic circuitry is mounted directly under the receiver.

It is often the case that the electrical path within the test fixture will be the greater part of the entire electrical path. This is generally caused by practical requirements, namely relating to the initial manufacturing process and subsequent need to gain access to the fixture wiring for maintenance and modifications. A typical known fixture construction is shown in FIG. 2. Ideally the wire path would be as in FIG. 3. Such a wire path does not permit the test head to hinge as in FIG. 2. Access to the receptacles in the test head for wiring purposes can instead be gained by segmenting the interface in the manner shown in FIG. 4a. In this case each interface strip may be removed to allow access to the inside face for wiring purposes, FIG. 4b. Alternatively, the interface strip may be removed in order to gain access to the internal face of the test head FIG. 4c. When reassembled the interface panel must still be capable of engaging the ATE receiver.

In the case where the interface panel of a short wire length fixture is to be engaged with the ATE receiver by means of differential air pressure applied across the panel, generally described as vacuum actuation, in order for a difference of air pressure to be maintained across the interface panel the panel must be sealed around its perimeter where it comes into contact with the ATE receiver, and must also be continuously sealed across its entire area. It follows that an interface panel of the type shown in FIG. 5 must provide a means of sealing the individual strips together. The method by which air pressure is then used to engage the receiver probes is shown in FIG. 6. Such methods are already known but suffer from certain disadvantages.

In particular the vacuum actuation of a segmented interface panel requires that the air seal between each interface strip shall be entirely airtight at all times, or else that the equipment used to cause a reduction in air pressure between the fixture interface panel and ATE receiver should be capable of sustaining the desired pressure difference ('vaccum') while the interface panel permits air leakage to occur. If the vacuum supply through the ATE cannot maintain the necessary pressure difference when a test fixture with a leaking interface panel is installed, the test fixture may fail to make reliable contact with the ATE.

It is an object of the present invention to provide a test fixture for use in test apparatus whereby the above disadvantage can be obviated or minimised.

According to the invention there is provided a test fixture for use in test apparatus for testing printed circuit boards and the like, including a test head having a platen mounting test probes and an interface panel spaced therefrom, the test head mounted test probes and the interface panel being connected by minimum length wiring, wherein a vacuum chamber is created between the platen of the test head and automatic test equipment.

It will be appreciated that by causing the platen of the test head to be the imperforate main plate of the interface vacuum chamber it is no longer necessary for the interface panel to be air-tight. The interface can, therefore, be made up of individual strips seperable to allow access to the minimal length wiring extending between the interface panel and the test head platen. Indeed, to allow easy flow of air through the interface panel it is desirable that the interface panel be perforate to allow easy flow.

There is also provided in accordance with the present invention test apparatus comprising: an automatic test equipment for testing printed circuit boards and the like, said automatic test equipment having a receiver for connection to a test fixture; and a test fixture comprising a test head having a platen, test probes mounted on the platen for contacting a unit under test, and an interface panel spaced from the test head and connected to the receiver of the automatic test equipment, the test head probes and the interface panel being interconnected by minimum length wiring; the test fixture and the automatic test equipment cooperating to provide a vacuum chamber between the platen of the test head and the automatic test equipment.

By minimum length wiring is meant a system of wiring between the test probes of the test head and the interface panel, in a test fixture, in which the wiring is substantially of the minimum length required to provide the interconnection between the test probes and the interface panel, when the test head and interface panel are in their normal working positions.

The test head platen and the interface panel can be connected by air-tight structure and said air-tight structure can be connected to the ATE receiver by seal means. Alternatively the vacuum chamber can be defined by a seal extending from the ATE receiver platen to the platen of the test head. In either case, said seal means should be sufficiently flexible to allow movement of the fixture towards and away from its engaged position with the ATE receive.

In order to discourage deformation of the test head platen and the interface panel it is desirable for these two parts to be connected by frame or like structure which will support the test head platen and transfer loads between it and the interface panel in use.

Independently of the aforesaid vacuum system and in conventional manner the test head platen can form one part of a vacuum chamber whose other face can be formed by either the unit under test or a pressure plate assembly placed directly or indirectly over the unit under test. This secondly described vacuum system is conventional and it will be appreciated that it can function perfectly well separately from the vacuum system between the test head platen and the ATE receiver, provided that the vacuum supply means for both vacuum chambers is not routed in such a way that sudden leakage in one chamber will deprive the other chamber of evactuation means.

The invention will be described further, by way of example, with reference to the accompanying drawings wherein.

Figure 1:
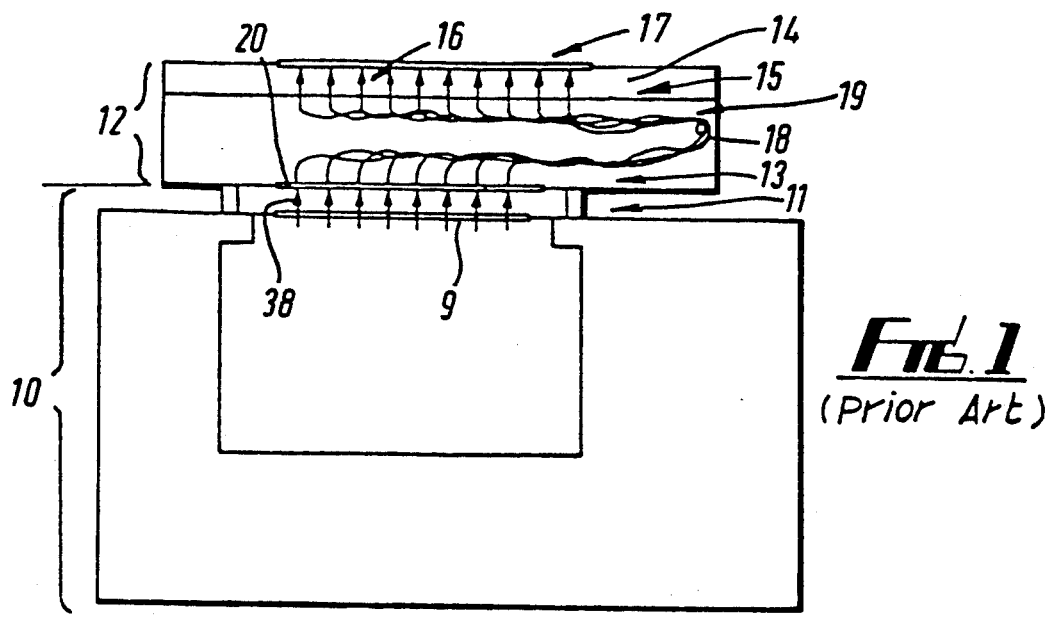
FIG. 1 is a schematic view illustrating known test apparatus.
Figure 2:
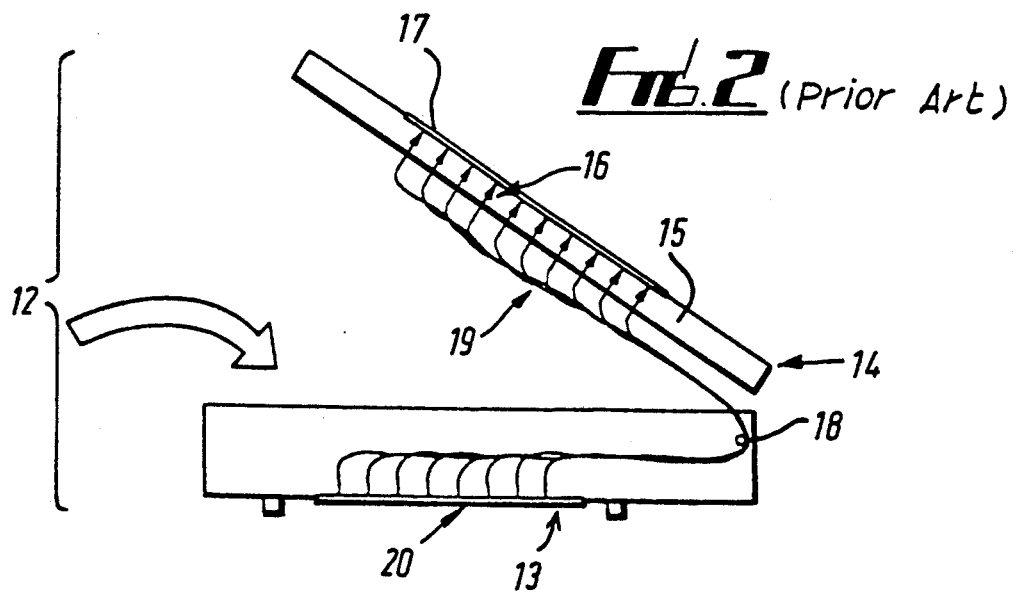
FIG. 2 is a more complete drawing of the apparatus of FIG. 1.

Referring firstly to FIGS. 1 and 2, known test apparatus includes automatic test equipment 10 having a tester interface or receiver 11 having a receiver platen 9 and receiver probes 38. Above the receiver 11 is arranged a test fixture 12 which includes an interface panel 13 and a test head 14 having a platen 15 which mounts spring contact probes 16 for contacting points on a unit under test 17 such as a printed circuit board or like component. The fixture is hinged at 18 and internal wiring follows paths shown at 19 allowing the test head 14 to pivot relative to the interface panel 13 for access to the wiring 19 if the interconnections of the probes 16 with pads 20 on the interface panel 13 need to be changed. FIG. 2 shows how access may be gained to the probes 16 and interface pads 20 for wiring purposes. When carrying out modifications to a previously assembled fixture, interconnections would normally be made by wire wrapping means using hand held tools. For initial manufacturing purposes the fixture wiring 19 may be installed with the fixture in a partially dismantled condition and the interconnections may be made by manual, semi automatic or automatic means. These items and processes are conventional.

Figure 3:
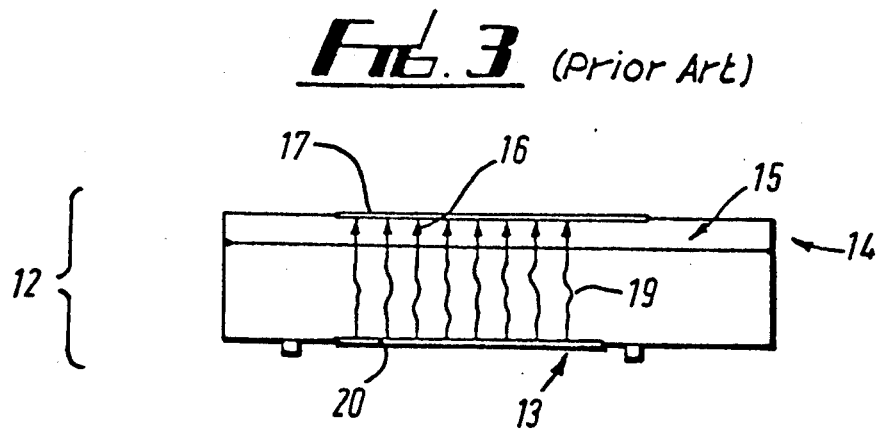
FIG. 3 is a view similar to that of FIG. 2, but illustrating a development thereof (also part of the prior art)
Figure 4A:
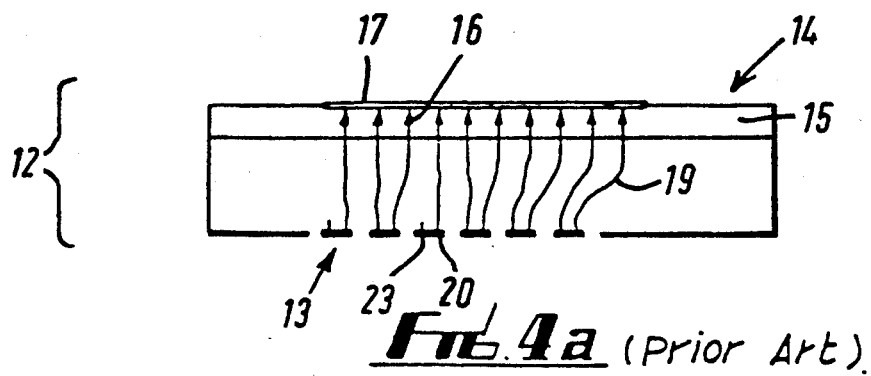
FIGS. 4a, 4b and 4c show means of using test apparatus shown in FIG. 3.
Figure 4B:
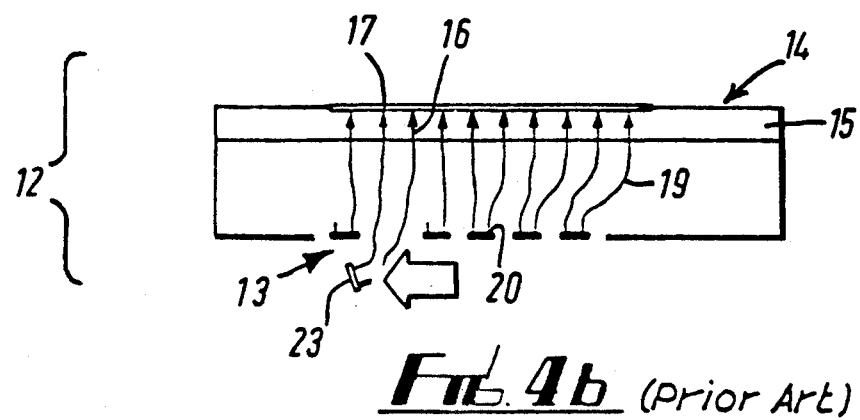
Figure 4C:
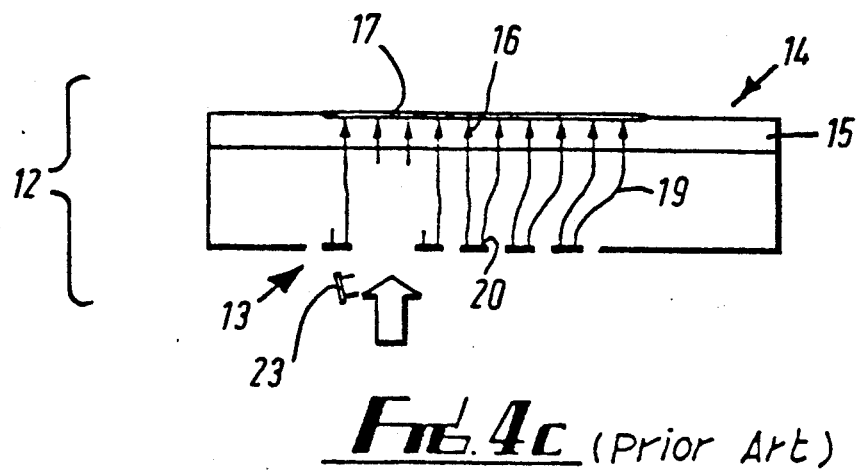
Figure 5:
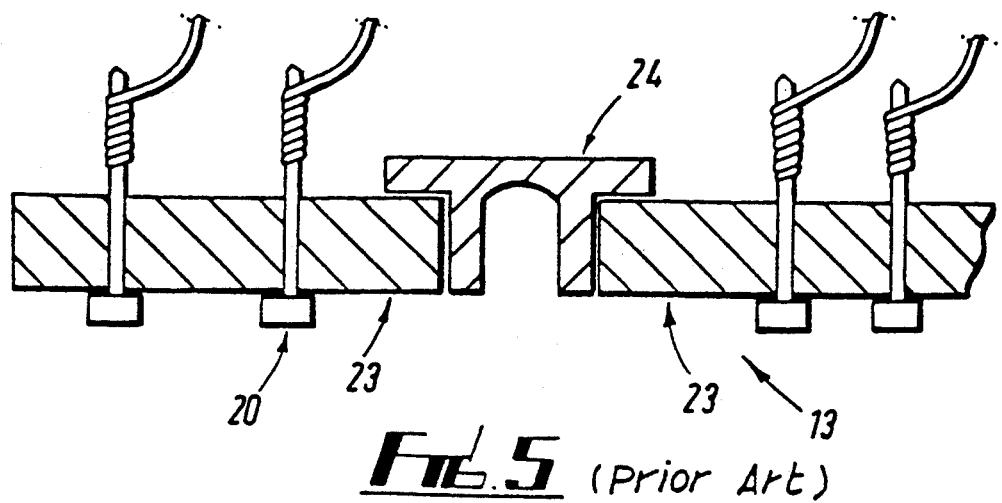
FIG. 5 shows a detail of one method of construction of the apparatus shown in FIG. 3.
Figure 6:
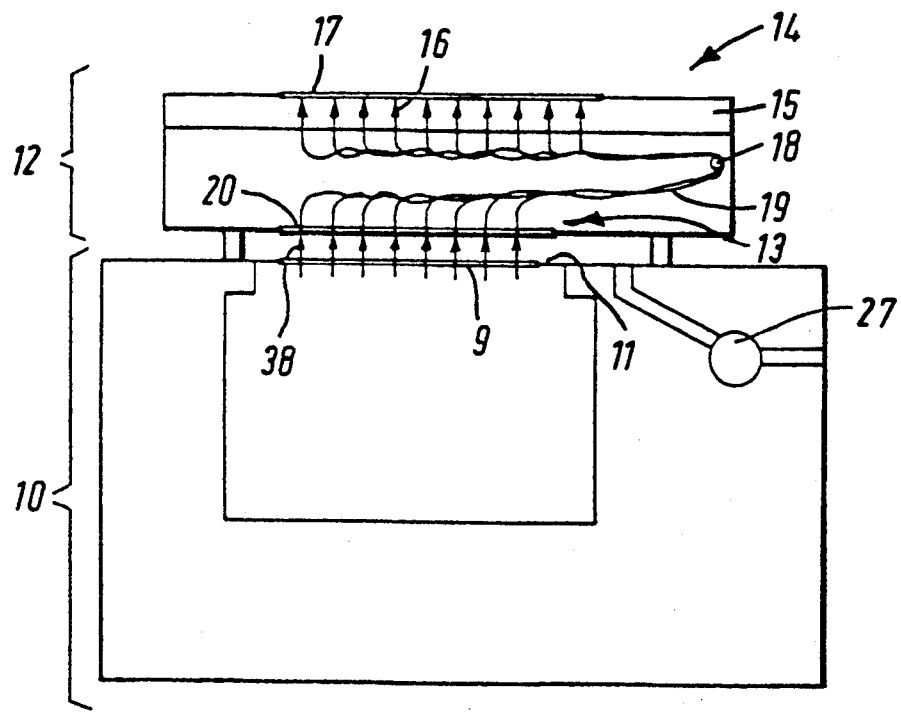
FIG. 6 is a schematic view showing known means of engaging apparatus in FIG. 1.

FIG. 3 illustrates another embodiment of a known test fixture apparatus wherein the long wire path 19 has been eliminated and a "minimum wire length" system has been introduced. As discussed in the introduction, much testing now must be done with a minimum wire length extending between the interface panel 13 and the platen 15. This eliminates the possibility of a hinge as described. FIGS. 4a, b and c show one method by which the problem of access to the wiring has been partially solved by the use of a segmented interface panel 13, a detail of one embodiment of which is shown in FIG. 5. The segmented interface panel 13 consists of strips 23 which carry the contact pads 20 and compliant seal strips 24 alternating between the strips 23. In practice, it has proved difficult for the seal strips to perform their function adequately. Further, the seal strips have to be manufactured to close tolerances and the whole assembly has to be assembled very carefully. Even so, the vacuum means installed in certain types of ATE is such that a segmented vacuum interface panel does not seal effectively. Theoretically it would be possible to overcome this problem in existing equipment FIG. 6 by increasing the capacity of the vacuum system 27. In practice, within the confines of existing automatic test equipment 10 upgrading the vacuum means would be expensive or potentially not even possible.

Figure 7:
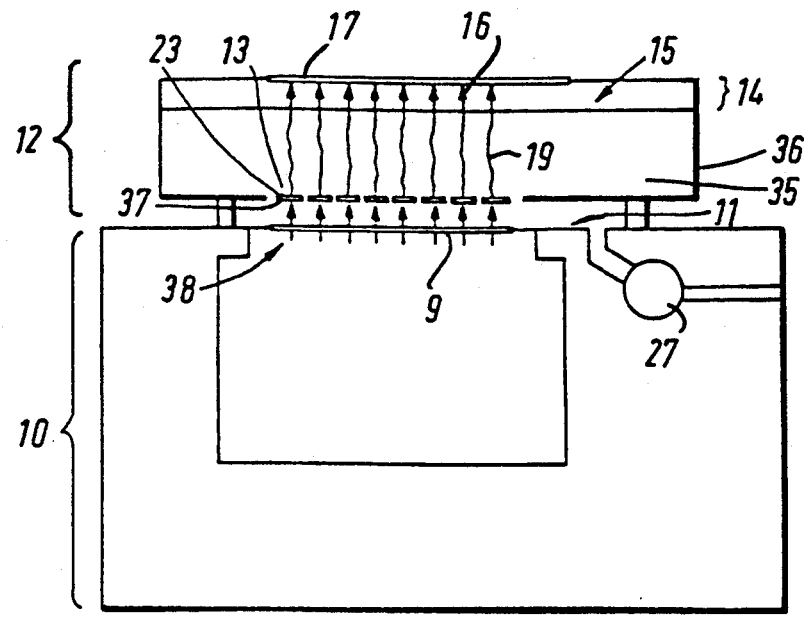
FIG. 7 is a schematic view illustrating a first preferred apparatus of the invention.

FIG. 7 illustrates a preferred test fixture 12 of the invention in combination with automatic test equipment 10 which has its own vacuum system indicated generally at 27. In the fixture 12 sealing is effected between the platen 15 of the test head 14 and the top surface of the ATE receiver 11. The fixture 12 can have a segmented interface panel 13 (having strips 23) which can be deliberately made to be air permeable to allow the vacuum system 27 to draw air out of the fixture chamber 35. The interface panel 13 and the platen 15 are interconnected by a frame structure 36 which supports the platen 15 against bending under the influence of atmospheric pressure and also ensures that the press load is transmitted uniformly to the strips 23 of the interface panel 13 which carry the pads 20 and urge them into engagement with the probes 38 of the ATE receiver. In use, the fixture functions in precisely the same way as prior known fixtures except that the interface vacuum chamber 35, instead of being bounded by the interface panel 13, extends up to the lower surface of the test head platen 15. This relieves the interface panel 13 of any sealing function and allows it to be divided up, for example, into strips 23 or any other convenient parts, which parts can be individually removed and access gained to wiring therebetween to allow firstly construction thereof and secondly modification of the wiring in case the fixture needs to be changed after it has been manufactured.

Figure 8:
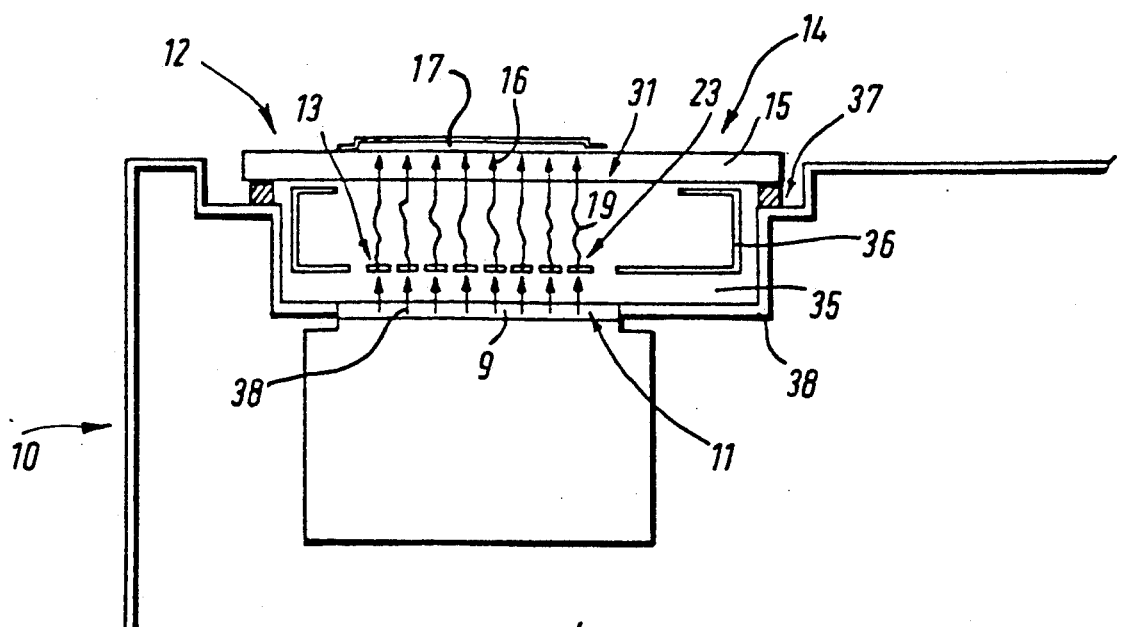
FIG. 8 is a comparable view illustrating the second preferred embodiment of apparatus of the invention.

FIG. 8 illustrates a variation on the above described fixture. In the embodiment described in FIG. 8 the platen 15 is mechanically connected to frame structure 36 which carries the strips 23. Receiver side walls 39 have at their edge a seal 37 which engages with the platen 15. This equipment otherwise functions in the same way as the apparatus described in FIG. 7 above.

The invention includes test apparatus comprising the fixture and the automatic test equipment. It also covers the test fixture alone.

The invention is not limited to the detail of the foregoing description and variations can be made thereto within the scope of the invention.

I claim:

1. A test fixture for use with an automatic test equipment for testing printed circuit boards and the like, the automatic test equipment having a receiver for mating with the test fixture, the receiver comprising a receiver platen, and receiver probes mounted on the platen for making electrical contact with the test fixture;

the test fixture comprising:

a test head having a test head platen mounting test probes for contacting a unit under test, and an air permeable interface panel spaced from the test head for contacting the receiver probes of the automatic test equipment, the test head probes and the interface panel being interconnected by minimum length electrical paths;

the test fixture being adapted to provide a vacuum chamber extending between the test head platen of the test fixture and the receiver platen of the automatic test equipment when connected thereto for testing purposes.

2. A test fixture for use with an automatic test equipment for testing printed circuit boards and the like, the automatic test equipment having a receiver for mating with the test fixture, the receiver comprising a receiver platen, and receiver probes mounted on the platen for making electrical contact with the test fixture;

the test fixture comprising:

a test head having a test head platen mounting test probes for contacting a unit under test, and an air permeable interface panel spaced from the test head for contacting the receiver probes of the automatic test equipment, the test head probes and the interface panel being interconnected by minimum length electrical paths;

the test fixture being adapted to provide a vacuum chamber extending between the test head platen of the test fixture and the receiver platen of the automatic test equipment when connected thereto for testing purposes, wherein the interface panel is made up of individual separable strips.

3. A test fixture for use with an automatic test equipment for testing printed circuit boards and the like, the automatic test equipment having a receiver for mating with the test fixture, the receiver comprising a receiver platen, and receiver probes mounted on the platen for making electrical contact with the test fixture;

the test fixture comprising:

a test head having a test head platen mounting test probes for contacting a unit under test, and an air permeable interface panel spaced from the test head for contacting the receiver probes of the automatic test equipment, the test head probes and the interface panel being interconnected by minimum length electrical paths;

the test fixture being adapted to provide a vacuum chamber extending between the test head platen of the test fixture and the receiver platen of the automatic test equipment when connected thereto for testing purposes, wherein the test head platen and the interface panel are connected by air-tight structure.

4. A fixture as claimed in claim 3, wherein said airtight structure has seal means for connecting the airtight structure to the receiver of an automatic test equipment.

5. A fixture as claimed in claim 4 wherein the seal means extends from the receiver platen of the automatic test equipment to the test head platen of the test head.

6. A fixture as claimed in claim 4 wherein said seal means is sufficiently flexible to allow movement of the fixture towards and away from its engaged position with the automatic test equipment receiver.

7. A test fixture for use with an automatic test equipment for testing printed circuit boards and the like, the automatic test equipment having a receiver for mating with the test fixture, the receiver comprising a receiver platen, and receiver probes mounted on the platen for making electrical contact with the test fixture;

the test fixture comprising:

a test head having a test head platen mounting test probes for contacting a unit under test, and an air permeable interface panel spaced from the test head for contacting the receiver probes of the automatic test equipment, the test head probes and the interface panel being interconnected by minimum length electrical paths;

the test fixture being adapted to provide a vacuum chamber extending between the test head platen of the test fixture and the receiver platen of the automatic test equipment when connected thereto for testing purposes, wherein, in order to discourage deformation of the test head platen and the interface panel these two parts are connected by structure which will support the test head platen and transfer loads between it and the interface panel in use.

8. Test apparatus comprising:

an automatic test equipment for testing printed circuit boards and the like, said automatic test equipment having a receiver comprising (A) a receiver platen, and (B) receiver probes mounted on the platen;

a test fixture for connection to the receiver of the automatic test equipment, the test fixture including (A) a test head having a platen and test probes mounted on the platen for contacting a unit under test, and (B) an air permeable interface panel spaced from the test head and contacting the receiver probes of the automatic test equipment, the test head probes and the interface panel being interconnected by minimum length electrical paths; and a vacuum chamber extending between the test head platen of the test head and the receiver platen of the automatic test equipment for holding the test fixture in contact with the automatic test equipment.

9. Apparatus as claimed in claim 8 wherein the interface panel is made up of individual separable strips.

10. Apparatus as claimed in claim 8, wherein the test head platen and the interface panel are connected by an air-tight structure.

11. Apparatus as claimed in claim 10 wherein said air-tight structure has seal means connecting the air-tight structure to the receiver of the automatic test equipment.

12. Apparatus as claimed in claim 11 wherein the seal means extends from a receiver platen of the automatic test equipment to the said platen of the test head.

13. Apparatus as claimed in claim 11 wherein said seal means is sufficiently flexible to allow movement of the fixture towards and away from its engaged position with the automatic test equipment receiver.

14. Apparatus as claimed in claim 8 wherein, in order to discourage deformation of the test head platen and the interface panel these two parts are connected by structure which will support the test head platen and transfer loads between it and the interface panel in use.

15. Test apparatus comprising:

an automatic test equipment for testing printed circuit boards and the like, said automatic test equipment having a receiver comprising (A) a receiver platen, and (B) receiver probes mounted on the platen;

a test fixture for connection to the receiver of the automatic test equipment, the test fixture including (A) a test head having a platen and test probes mounted on the platen for contacting a unit under test, and (B) an air permeable interface panel spaced from the test head and contacting the receiver probes of the automatic test equipment, the interface panel having contact pads positioned to make contact with the said receiver probes of the automatic test equipment, and the interface panel being made up of individual separable parts, the test head probes and the interface panel being interconnected by minimum length electrical paths, and the separable parts of the interface panel being separable to give access to the minimum length wiring; and a vacuum chamber extending between the test head platen of the test head and the receiver platen of the automatic test equipment for holding, the test fixture in contact with the automatic test equipment.

* * * * *